United States Patent [19]
Atsumi

[11] Patent Number: 5,243,569
[45] Date of Patent: Sep. 7, 1993

[54] DIFFERENTIAL CELL-TYPE EPROM INCORPORATING STRESS TEST CIRCUIT

[75] Inventor: Shigeru Atsumi, Tokyo, Japan

[73] Assignee: Kabushiki Kaisha Toshiba, Kawasaki, Japan

[21] Appl. No.: 673,479

[22] Filed: Mar. 22, 1991

[30] Foreign Application Priority Data

Mar. 22, 1990 [JP] Japan .................................. 2-69721

[51] Int. Cl.⁵ .............................................. G11C 7/00
[52] U.S. Cl. .................................... 365/201; 365/207
[58] Field of Search ................ 365/189.09, 189.11, 365/201, 207; 371/21.1

[56] References Cited

U.S. PATENT DOCUMENTS 4,970,691 11/1990 Atsumi et al. ................. 365/189.11

FOREIGN PATENT DOCUMENTS 2053611A 2/1981 United Kingdom .

OTHER PUBLICATIONS

"A 25ns 16K CMOS PROM Using A 4-Transistor Cell." ISSCC 1985 Digest of Technical Papers.

Primary Examiner—Steven Mottola
Attorney, Agent, or Firm—Banner, Birch, McKie & Beckett

[57] ABSTRACT

A differential cell-type non-volatile semiconductor device having first and second memory cell is disclosed. Two cell transistors of corresponding addresses in the first and second memory cell arrays are used to constitute a single memory cell. Each of writing transistors for writing data in the cell transistors is provided to the first and second memory cell arrays. Complementary data are written in the two cell transistors selected in the first and second memory cell arrays. Readout potentials from the two cell transistors are amplified by a differential amplifier, thereby reading out stored data. The memory device has a stress test control circuit for controlling, in a stress test mode, writing transistors such that they are all simultaneously turned on/off.

11 Claims, 2 Drawing Sheets

DIFFERENTIAL CELL-TYPE EPROM INCORPORATING STRESS TEST CIRCUIT

BACKGROUND OF THE INVENTION

1. Field of the Invention

The present invention relates to a non-volatile semiconductor memory device and, more particularly, to a differential cell-type EPROM incorporating a stress test circuit.

2. Description of the Related Art

A read-only memory of a type whose data can be erased by means of an ultraviolet ray so as to enable data rewrite, i.e., a so-called EPROM, is widely known by, e.g., U.S. Pat. Nos. 3,660,819 (1972), 3,744,036 (1973), and 3,755,721 (1973).

In the EPROM, when a memory cell (cell transistor) is selected to write data, a word line and a bit line connected to this memory cell are set at a high potential. Then, a high potential is also applied to the drain or control gate of non-selected memory cells connected to the same word line and bit line of the selected memory cell, and electrons charged in the floating gate are sometimes discharged due to the stress applied to the drain o control gate of the non-selected memory cells. As a result, stored data is inverted, causing problems.

In order to evaluate data retaining characteristics of an EPROM, a reliability test such as a drain stress test and a gate stress test is performed by forcibly giving stress to the drains or control gates of the memory cells. In the drain stress test, a high potential is applied to the gates of all the column selecting transistors in order to turn on these transistors. In this case, when a write transistor is turned off, the drains of all the column selecting transistors are set at 0 V. Then, stress can be given to the gate insulating films of the column selecting transistors. Therefore, the stress test for the column selecting transistors is often performed in addition to the drain stress test. The gate stress test and the stress test for the column selecting transistors are common in that both tests are performed by turning off the write transistor. Therefore, these two tests can be simultaneously performed by selecting all the word lines.

In the stress test, since stress must be given to the drains or control gates of all the memory cells, the time required for testing is prolonged as the memory capacity is increased. In order to shorten the test time, e.g., U.K. Patent Application No. GB2,053,611 published (Feb. 4, 1981) by Vernon George McKenney et al. proposes to incorporate in an EPROM a stress test circuit having a function of performing the stress as described above on the memory cells.

Recent technology trends require high speed operation for an EPROM as well as other memory devices. Various methods are available to realize a short access time. Among those methods, a differential cell method is known. Basically, the differential cell method uses two cell transistors to constitute a single memory cell (in other words, 1-bit data is stored using two cell transistors). Complementary data are written in two cell transistors. Readout potentials from the two cell transistors are input to a differential amplifier, thereby amplifying the difference and thus reading out stored data. This differential cell-type EPROM is described in, e.g., "A 25ns 16K CMOS PROM using a 4-Transistor Cell" by Saroj Pathak et al. in 1985 IEEE International Solid-State Circuits Conference DIGEST OF THE TECHNICAL PAPERS, pp. 162, 163 and in U.S. Pat. No. 4,970,691 (1990) by the present inventors.

However, in the differential cell-type EPROM, if a stress test for a single end cell-type EPROM in which a single transistor memory cell is employed, the time required for the drain stress test may be doubled, or the write transistor may be broken during the gate stress test. These problems arise because two write transistors corresponding to two memory cell arrays are complementarily turned on/off (i.e., only one of the write transistors can be turned on). As a result, the stress test for the drain and/or the column selecting transistor must be separately performed for two memory cell arrays, thus doubling the test time. When the gate stress test is to be performed, or the gate stress test and the stress test for the column selecting transistors are to be simultaneously performed, the write transistor must be turned off. In the differential cell-type EPROM, one of the two write transistors is turned on and the remaining one is turned off, as described above. As a result, a high potential is applied to the gate and drain of the write transistor which is in an ON state, and the source is substantially at 0 V. Then, a stress is applied to the gate insulating film of this transistor, resulting in breakdown.

SUMMARY OF THE INVENTION

It is, therefore, the object of the present invention to provide a differential cell-type non-volatile semiconductor memory device incorporating a stress test circuit which can be subjected to a stress test of a short period of time without causing breakdown of the write transistors.

The object of the present invention is achieved by a differential cell-type non-volatile semiconductor memory device comprising: a plurality of memory cell arrays having matrices of memory cells; a row selecting circuit for selecting memory cells connected to corresponding rows of the plurality of memory cell arrays; a column selecting circuit for selecting memory cells connected to corresponding columns of the plurality of memory cell arrays; a differential amplifier for differentially amplifying data read out from the memory cells of corresponding addresses that are selected from the plurality of memory cell arrays by the row selecting circuit and column selecting circuit; a readout circuit for reading out data in accordance with an output from the differential amplifier; a write circuit for writing complementary data in the selected memory cells of the corresponding addresses of the plurality of memory cell arrays, the write circuit having a plurality of writing transistors for writing data in the memory cells of the plurality of memory cell arrays; and a stress test control circuit for controlling the plurality of writing transistors to be simultaneously turned on/off during a stress test mode.

In the above arrangement, all the write transistors are turned on/off simultaneously in the drain stress test mode in accordance with a write data signal, and identical data are written in a plurality of cell transistors of each memory cell array. As a result, a potential stress can be applied to the respective cell transistors simultaneously, thereby performing the stress test within a short period of time without causing breakdown of the write transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

A preferred embodiment of the present invention will be described in detail with reference to the accompanying drawings.

Figure 1:
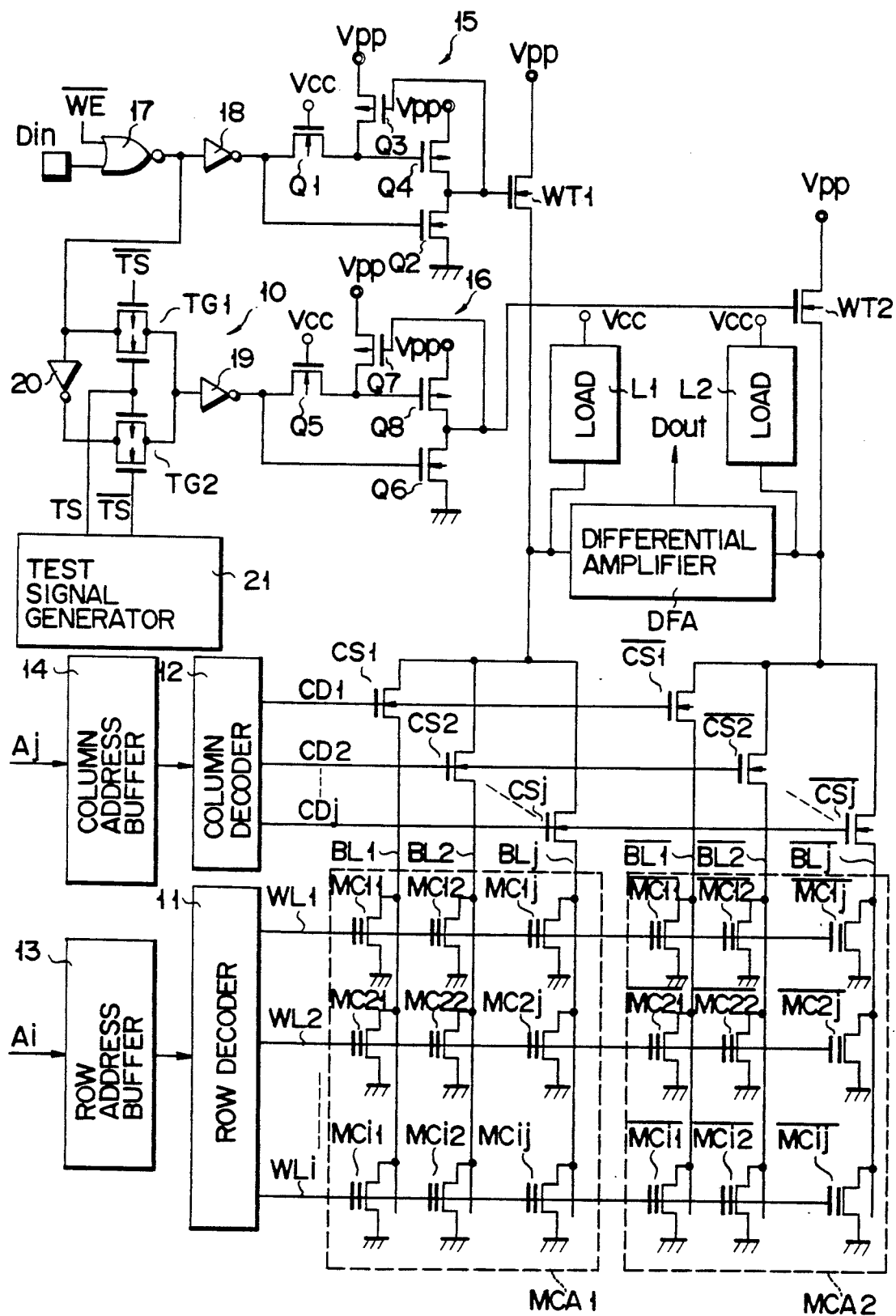
FIG. 1 is a circuit diagram of a data read circuit system and a data write circuit system of a differential cell-type non-volatile semiconductor memory device according to an embodiment of the present invention.

FIG. 1 shows a data read circuit and a data write circuit system of a differential cell-type EPROM incorporating a stress test circuit. A first memory cell array MCA1 consists of cell transistors MC11 to MCij in a matrix of i rows×j columns. A second memory cell array MCA2 consists of cell transistors $\overline{MC11}$ to $\overline{MCij}$ in a matrix of i rows×j columns. The control gates of the cell transistors MC on the corresponding rows of the memory cell arrays MCA1 and MCA2 are commonly connected to word lines WL1 to WLi, and the sources thereof are grounded. The drains of the cell transistors MC on the corresponding columns of the memory cell array MCA1 are commonly connected to bit lines BL1 to BLj. One end of each of the current paths of column selecting transistors CS1 to CSj is connected to one end of the corresponding one of the bit lines BL1 to BLj, and the other end thereof serves as a common end. Output signals (row selecting signals) from a row decoder 11 are supplied to the word lines WL1 to WLi. Output signals (column selecting signals) CD1 to CDj from a column decoder 12 are supplied to the gates of the corresponding column selecting transistors CS1 to CSj and $\overline{CS1}$ to $\overline{CSj}$ of the memory cell arrays MCA1 and MCA2. A row address signal Ai detected by a row address buffer 13 is supplied to the row decoder 11. A column address signal Aj detected by a column address buffer 14 is supplied to the column decoder 12.

The first input node of a differential amplifier DFA is connected to the common node as the other end of the current paths of the column selecting transistors CS1 to CSj, and the second input node thereof is connected to the common node as the other end of the current paths of the column selecting transistors $\overline{CS1}$ to $\overline{CSj}$. A data read load L1 is connected between the first input node of the differential amplifier DFA and a power source Vcc, and a data read load L2 is connected between the second input node of the differential amplifier DFA and the power source Vcc. The output node of the differential amplifier DFA outputs read data Dout.

The current path of a write transistor WT1 that serves as a data write load for the memory cell array MCA1 is connected between the first input node of the differential amplifier DFA and a high-potential power source Vpp. The current path of a write transistor WT2 that serves as a data write load for the memory cell array MCA2 is connected between the second input node of the differential amplifier DAF and the high-potential power source Vpp. The transistor WT1 is turned on/off by an output signal from a voltage transformer 15. The transistor WT2 is turned on/off by a output signal from a voltage transformer 16. The voltage transformer 15 transforms a signal of the Vcc level input via a NOR gate 17 and an inverter 18 to a signal of the Vpp level. Similarly, the voltage transformer 16 transforms a signal of the Vcc level input via the NOR gate 17, a stress test control circuit 10, and the inverter 19 to a signal of the Vpp level. The voltage transformer 15 includes n-channel MOS transistors Q1 and Q2 and p-channel MOS transistors Q3 and Q4. The voltage transformer 16 includes n-channel MOS transistors Q5 and Q6 and p-channel MOS transistors Q7 and Q8. The stress test control circuit 10 controls the write transistors WT1 and WT2 such that they are turned on/off simultaneously in the stress test mode, and includes an inverter 20 and CMOS transfer gates TG1 and TG2. The transfer gates TG1 and TG2 are turned on/off based on test signals TS and $\overline{TS}$ output from a test signal generator 21. The control circuit 10 serves as a switching circuit to selectively supply an output signal from the NOR gate 17 either to the inverter 19 through the transfer gate TG1 or to the inverter 20 to invert it and thereafter to the inverter 19 through the transfer gate TG2. The test signal TS is enabled ("H" level) during both the drain stress test and the gate stress test and is disabled ("L" level) during the normal operation.

The arrangement of the write circuit system will be described in detail. A write enable signal $\overline{WE}$ and a write data signal Din are supplied to the two-input NOR gate 17. The output node of the NOR gate 17 is connected to the input node of the inverter 18, one end of the transfer gate GT1, and the input node of the inverter 20. The output node of the inverter 18 is connected to one end of the current path of the transistor Q1 and the gate of the transistor Q2. The other end of the current path of the transistor Q1 is connected to the gate of the transistor Q4, and the gate thereof is connected to the power source Vcc. One end of the current path of the transistor Q4 is connected to the high-potential power source Vpp and the other end thereof is connected to one end of the current path of the transistor Q2. The other end of the current path of the transistor Q2 is grounded. The common node of the transistors Q4 and Q2 is connected to the gate of the transistor WT1. The current path of the transistor Q3 is connected between the gate of the transistor Q4 and the high-potential power source Vpp, and the gate thereof is connected to the common node of the transistors Q4 and Q2. The output node of the inverter 20 is connected to one end of the transfer gate TG2. The other ends of the transfer gates TG1 and TG2 are connected to the input node of the inverter 19. The output node of the inverter 19 is connected to one end of the current path of the transistor Q5 and the gate of the transistor Q6. The other end of the current path of the transistor Q5 is connected to the gate of the transistor Q8, and the gate thereof is connected to the power source Vcc. One end of the current path of the transistor Q8 is connected to the high-potential power source Vpp, and the other end thereof is connected to one end of the current path of the transistor Q6. The other end of the current path of the transistor Q6 is grounded. The common node of the transistors Q8 and Q6 is connected to the gate of the transistor WT2. The current path of the transistor Q7 is connected between the gate of the transistor Q8 and the high-potential power source Vpp, and the gate thereof is connected to the common node of the transistors Q8 and Q6.

Figure 2:
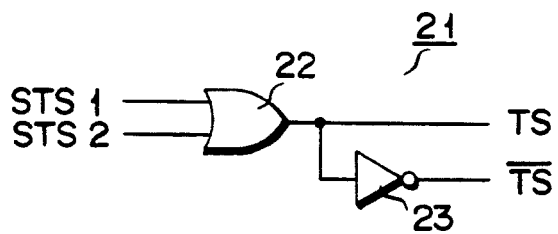
FIG. 2 is a circuit diagram of an example of a test signal generator of the circuit shown in FIG. 1.

FIG. 2 shows the arrangement of the test signal generator 21 shown in FIG. 1. The generator 21 includes a two-input OR gate 22 and an inverter 23. One input end of the OR gate 22 receives a first stress test signal STS1 for designating the stress test for the drain or the column selecting transistor, and the other input end thereof receives a second stress test signal STS2 for designating the gate stress test, or simultaneous stress tests for the gate and the column selecting transistor. The test signal TS is output from the output node of the OR gate 22. The inverter 23 receives an output signal (test signal TS) from the OR gate 22 and outputs its inverted signal $\overline{TS}$. The stress test signals STS1 and STS2 are generated based on, e.g., three-value control voltages input from different address input pins.

Figure 3:
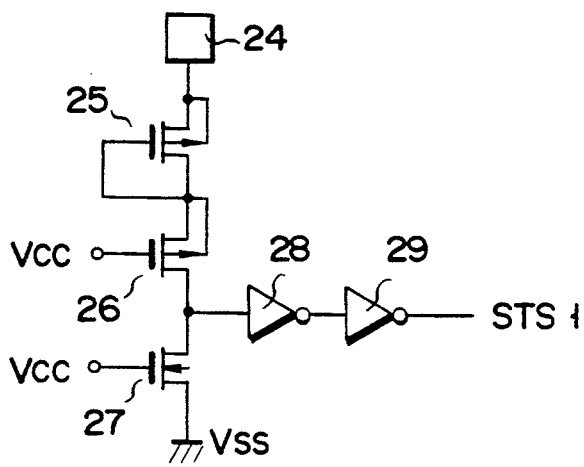
FIG. 3 is a circuit diagram of a three-value control circuit for generating a stress test signal to be supplied to the circuit shown in FIG. 2.

FIG. 3 shows a three-value control circuit as an example of a circuit for generating the stress test signal STS1 to perform the drain stress test function as described above. A series circuit of two p-channel MOS transistors 25 and 26 and the current path of an n-channel MOS transistor 27 is connected between an external input terminal (e.g., an address input terminal) 24 and a ground point Vss. The gate of the transistor 25 is connected to its drain, and the gates of the transistor 26 and a transistor 27 are connected to the power source Vcc. The common node of the transistors 26 and 27 is connected to the input node of an inverter 28, and the output node of the inverter 28 is connected to the input node of an inverter 29. The inverter 29 outputs the stress test signal STS1 from its output node.

In the three-value control circuit as described above, when an ordinary potential of the "H" (Vcc) or "L" (Vss) level is applied to the address input terminal 24, the transistor 25 is turned off, and the potential at the input node of the inverter 28 is set at "L" level by the ON transistor 27. Thus, the drain stress test signal STS1 output from the inverter 29 becomes the "L" (disabled) level.

On the other hand, when a control voltage "Vcc+2$V_{THP}$" (where $V_{THP}$ is the threshold voltage of a p-channel MOS transistor) or more which is considerably higher than the power source potential Vcc is applied to the address input terminal 24, the transistor 25 is turned on and the potential at the input node of the inverter 28 becomes Vcc or more. As a result, the drain stress test signal STS1 output from the inverter 29 becomes "H" level (enabled).

The stress test signal STS2 is generated by a three-value control circuit having a similar arrangement as that described above.

Figure 4:
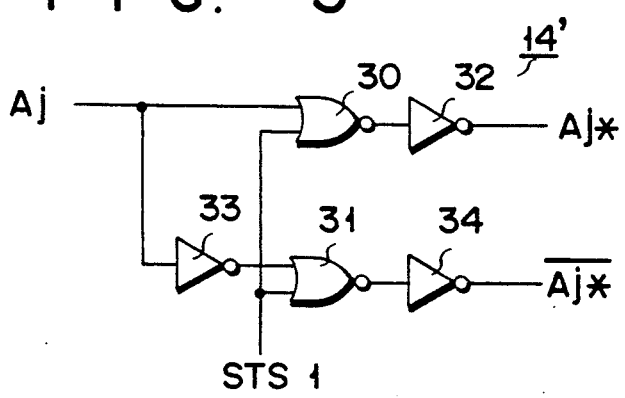
FIG. 4 is a circuit diagram of an arrangement that corresponds to one bit of a column address buffer shown in the circuit of FIG. 1.

FIG. 4 shows the arrangement of part of the column address buffer 14 of the circuit shown in FIG. 1 that corresponds to one bit. A buffer circuit 14' has a function of performing the drain stress test. More specifically, from an input column address signal Aj, the ordinary column address buffer 14 generates a signal Aj*, which is of the same phase as the signal Aj, and an inverted signal $\overline{Aj^*}$ and supplies them to the column decoder 12. However, in the case of the reliability test where the drain stress test signal STS1 is set at "H" level, all the outputs from the column decoder 12 must be at "H" level regardless of the level of the column address signal Aj. For this purpose, the column address buffer circuit 14' uses NOR gates 30 and 31 to set the column address signals Aj* and $\overline{Aj^*}$ simultaneously at "H" level when the stress test signal STS1 is at "H" level. More particularly, The column address signal Aj and the stress test signal STS1 are supplied to the NOR gate 30. An output from the NOR gate 30 is inverted by an inverter 32, thus generating the column address signal Aj*. The column address signal Aj, which has been inverted by an inverter 33, and the stress test signal STS1 are supplied to the NOR gate 31. An output from the NOR gate 31 is inverted by an inverter 34, thus generating the column address signal $\overline{Aj^*}$.

In the column address buffer circuit 14' as shown in FIG. 4, during the normal operation where the stress test signal STS1 is at "L" level, the NOR gates 30 and 31 serve as ordinary inverters. Therefore, the inverters 32 and 34 output the signal Aj*, which is the same phase as the input column address signal Aj, and the inverted signal $\overline{Aj^*}$. In contrast to this, during the reliability test where the stress test signal STS1 is set at "H" level, the outputs from the NOR gates 30 and 31 are at "L" level regardless of the level of the input column address signal Aj. Therefore, the inverters 32 and 34 output "H"-level column address signals Aj* and $\overline{Aj^*}$.

Figure 5:
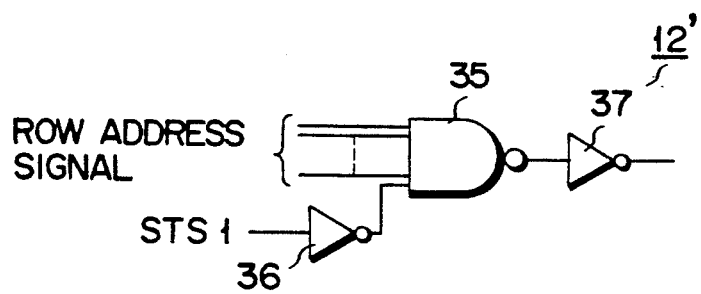
FIG. 5 is a circuit diagram of a partial decoder of a row decoder shown in FIG. 1 that drives a single word line.

FIG. 5 shows a partial decoder 12', of the row decoder 11 for achieving the drain test function, that drives a single word line. Normally, the partial decoder 12' receives an input row address signal having a plurality of bits and selectively drives a corresponding word line. However, in the case of the reliability test where the drain stress test signal STS1 is set at "H" level, control must be performed such that whatever row address signal may be input, a corresponding word line is not selected, i.e., an "L"-level signal is output onto the word line. For this purpose, in the partial decoder 12', the drain stress test signal STS1 is input, through an inverter 36, to one input node of a NAND gate 35 that receives the row address signal having a plurality of bits output from the row address buffer 13. An output signal from the NAND gate 35 is inverted by an inverter 37, and the corresponding word line is driven by the inverted signal.

In the partial decoder 12' having the arrangement described above, during the reliability test where the drain stress test signal STS1 is set at "H" level, the output signal from the inverter 36 is set at "L" level, and thus the output signal from the NAND gate 35 is set at "H" level regardless of the level of the row address signal. As a result, the output signal from the inverter 37 becomes "L" level, and no word line is selected regardless of the level of the input row address signal.

The operation of the EPROM shown in FIGS. 1 to 5 will be described. During an ordinary write operation, the test signals TS and $\overline{TS}$ output from the test signal generator 21 are at "H" level. Therefore, the transfer gates TG2 and TG1 are turned on and off, respectively. When the write enable signal $\overline{WE}$ is enabled ("L" level), inputs to the voltage transformers 15 and 16 are of the opposite phases, and the write transistors WT1 and WT2 are complementarily controlled. Namely, the write data signal Din is supplied to the gate of the transistor WT1 via the NOR gate 17, the inverter 18, and the voltage transformer 15. The write data signal Din is supplied to the gate of the transistor WT2 via the NOR gate 17, the inverter 20, the transfer gate TG2, the inverter 19, and the voltage transformer 16. As a result, complementary data corresponding to the write data signal Din are written in a memory cell MCmn (m is an integer between 1 and i, and n is an integer between 1 and j) of the memory cell array MCA1 and a memory cell $\overline{MCmn}$ of the memory cell array MCA2 that are selected by the row decoder 11 and the column decoder 12, and the write operation of the differential cell-type EPROM is enabled.

In contrast to this, during the stress test for the drain and the column selecting transistor, the test signals TS and $\overline{TS}$ output from the test signal generator 21 are set at "H" and "L" levels, respectively, and the transfer gates TG1 and TG2 are turned on and off, respectively. When the write enable signal $\overline{WE}$ is at "L" level, the write data signal Din is supplied to the gate of the transistor WT1 via the NOR gate 17, the inverter 18, and the voltage transformer 15, and also to the gate of the transistor WT2 via the NOR gate 17, the transfer gate TG1, the inverter 19, and the voltage transformer 16. As a result, the input to the transformer 15 and that to the transformer 16 become of the same phase, and the write transistors WT1 and WT2 are controlled to be turned on/off simultaneously in accordance with the write data signal Din. When the write data signal Din is set at "H" level, the transistors WT1 and WT2 are simultaneously turned on. In this case, all the output signals CD1 to CDj of the column decoder 12 are set at "H" level, and all the column selecting transistors CS1 to CSj and $\overline{CS1}$ and $\overline{CSj}$ are turned on. As a result, stress can simultaneously be given to all the memory cells MC11 to MCij and $\overline{MC11}$ to $\overline{MCij}$ of the memory cell arrays MCA1 and MCA2.

When the write data signal Din is set at "L" level, the transistors WT1 and WT2 are turned off, and all the column selecting transistors CS1 to CSj and $\overline{CS1}$ to $\overline{CSj}$ are turned on, the stress test for the column selecting transistors CS1 to CSj and $\overline{CS1}$ and $\overline{CSj}$ can be performed.

In this manner, since stress can be applied simultaneously to the drains of the memory cells MC11 to MCij and $\overline{MC11}$ to $\overline{MCij}$ of the two memory cell arrays MCA1 and MCA2, the drain stress test can be accomplished within a short period of time. The stress test for the column selecting transistors CS1 to CSj and $\overline{CS1}$ and $\overline{CSj}$ can also be simultaneously performed. Furthermore, since the write transistors WT1 and WT2 are controlled to be simultaneously turned on/off, an OFF write transistor will not be damaged.

In the case of the gate stress test, all the output signals CD1 to CDj from the column decoder 12 are set at "L" level first, and all the word lines WL1 to WLi are selected (set at "H" level) by the outputs from the row decoder 11, so that stress is applied simultaneously to the control gates of the memory cells MC11 to MCij and $\overline{MC11}$ to $\overline{MCij}$ of the memory cell arrays MCA1 and MCA2.

The above embodiment exemplifies a differential cell-type non-volatile semiconductor memory device that has two memory cell arrays. However, the present invention can be similarly applied to a differential cell-type non-volatile semiconductor memory having four memory cell arrays or more.

As has been described above, according to the present invention, the semiconductor device has a stress test control circuit that performs, in the stress test mode, control such that the write transistors are simultaneously turned on/off in accordance with the write data signal. Therefore, a differential cell-type nonvolatile semiconductor memory device is provided that can be subjected to the stress test of a short period of time without causing breakdown of the write transistors.

What is claimed is:

1. A differential cell-type non-volatile semiconductor memory device comprising:
    a plurality of memory cell arrays having matrices of memory cells;
    row selecting means for selecting memory cells connected to corresponding rows of said plurality of memory cell arrays;
    column selecting means for selecting memory cells connected to corresponding columns of said plurality of memory cell arrays;
    differential amplifier means for differentially amplifying data read out from said memory cells of corresponding addresses that are selected from said plurality of memory cell arrays by said row selecting means and column selecting means;
    readout means for reading out data in accordance with an output from said differential amplifier means;
    write means for writing complementary data in said selected memory cells of the corresponding addresses of said plurality of memory cell arrays, said write means having a plurality of writing transistors for writing data in said memory cells of said plurality of memory cell arrays; and
    stress test control means for controlling said plurality of writing transistors to be simultaneously turned on/off during a stress test mode.

2. A device according to claim 1, wherein said memory cells of said plurality of memory cell arrays respectively include cell transistors each having a floating gate and a control gate.

3. A device according to claim 1, wherein said row selecting means includes a row address buffer circuit for detecting a row address signal and a row decoder for decoding an output signal from said row address buffer circuit.

4. A device according to claim 3, wherein in the stress test mode, said row decoder selects none of the rows of said plurality of memory cell arrays based on control by the stress test signal regardless of the level of the row address signal.

5. A device according to claim 1, wherein said column selecting means includes a column address buffer circuit for detecting a column address signal and a column decoder for decoding an output signal from said column address buffer circuit.

6. A device according to claim 5, wherein in the stress test mode, said column address buffer circuit selects none of the outputs from said column decoder based on control by the stress test signal regardless of the level of the column address signal.

7. A device according to claim 1, wherein said differential amplifier mean includes a differential amplifier having first and second input nodes, and first and second loads respectively connected between said first and second input nodes of said differential amplifier and a power source.

8. A device according to claim 1, wherein said write means includes:
   first voltage transforming means for transforming a power source voltage level signal to a high-potential power source level signal and turning on/off one of said write transistors;
   second voltage transforming means for transforming the power source voltage level signal to the high-potential power source level signal and turning on another one of said write transistors;
   first logic means for supplying, in a write enable state, a write data signal to said first voltage transforming means; and
   second logic means, controlled by an output signal from said stress test control means, for supplying, in the write enable state and an ordinary write mode, an inverted signal of the write data signal to said second voltage transforming means, and, in a write enable state and the stress test mode, a signal of the same phase as the write data signal to said second voltage transforming means.

9. A device according to claim 1, wherein said stress test control means performs control such that said plurality of write transistors are simultaneously turned on/off in accordance with the write data signal.

10. A device according to claim 1, wherein said stress test control mean operates based on an external three-value control voltage.

11. A device according to claim 10, wherein said stress test control means is controlled by an output from a three-value control circuit.

* * * * *